(12) United States Patent
Vishinsky

(10) Patent No.: US 7,400,212 B1
(45) Date of Patent: Jul. 15, 2008

(54) SELF-TUNED ACTIVE BANDPASS FILTERS

(76) Inventor: Adam S. Vishinsky, 1512 Highland Cir., Little Elm, TX (US) 75068-3787

( * ) Notice: Subject to any disclaimer, the term of this patent is extended or adjusted under 35 U.S.C. 154(b) by 323 days.

(21) Appl. No.: 11/146,379

(22) Filed: Jun. 7, 2005

(51) Int. Cl.
H04B 3/04 (2006.01)
H01P 1/20 (2006.01)

(52) U.S. Cl. ............... 333/17.1; 333/202; 327/552

(58) Field of Classification Search .................. None
See application file for complete search history.

(56) References Cited

U.S. PATENT DOCUMENTS

| | | | |
|---|---|---|---|
| 3,997,856 | A | 12/1976 | Canning et al. |
| 4,952,891 | A | 8/1990 | Moulding |
| 5,072,298 | A | 12/1991 | Sumiyoshi |
| 5,440,264 | A | 8/1995 | Sevenhans et al. |
| 5,471,168 | A | 11/1995 | Sevenhans et al. |
| 5,608,665 | A | 3/1997 | Wyszynski |
| 5,912,583 | A | 6/1999 | Pierson et al. |
| 5,914,633 | A | 6/1999 | Comino et al. |
| 5,994,951 | A * | 11/1999 | Mazhar et al. ............. 327/553 |
| 6,285,865 | B1 | 9/2001 | Vorenkamp et al. |
| 6,307,443 | B1 | 10/2001 | Gabara |
| 6,377,315 | B1 | 4/2002 | Carr et al. |
| 6,512,414 | B2 | 1/2003 | Yokoyama et al. |
| 6,778,023 | B2 | 8/2004 | Christensen |
| 6,795,696 | B2 | 9/2004 | Krug |
| 6,803,813 | B1 | 10/2004 | Pham |

OTHER PUBLICATIONS

Y. Tsividis, "Self-Tuned Filters," Electronic Letters, vol. 17, No. 12, pp. 406-407, Jun. 1981.
H. Khorramabadi, P. Gray, "High-Frequency CMOS Continuous-Time Filters," IEEE Journal of Solid-State Circuits, vol. 19, No. 12, pp. 939-948, 1984.
M. Banu and Y. Tsividis, "An Elliptic Continuous-Time CMOS Filter with On-Chip Automatic Tuning," IEEE Journal of Solid-State Circuits, vol. 20, No. 12, pp. 1114-1121, 1985.

(Continued)

*Primary Examiner*—Benny Lee
*Assistant Examiner*—Kimberly E Glenn
(74) *Attorney, Agent, or Firm*—Locke Lord Bissell & Liddell, LLP

(57) ABSTRACT

An automatically tuned on-chip active continuous-time real bandpass filter operates on a differential signal while simultaneously being tuned using a common-mode (CM) reference signal, which results in a superior accuracy of its center frequency and bandwidth. The filter consists of two or more pairs of $g_m$-C or other types active resonators that can be single-ended or differential. The two identical filters are tuned with CM reference that is rejected at the output of each pair of resonators. For each pair of resonators, the present frequency-tuning finds the resonant frequency, for which the bandpass (BP) and lowpass magnitude values are equal. For each pair of resonators, the present Q-tuning scheme adjusts BP magnitude at the resonant frequency and its Q to the appropriate value. The present tuning method allows building a reasonably flat passband BP filter using two or more pairs of resonators. Additionally, since both present tuning schemes rely on the amplitude detection the CM reference signal can be made small, which prevents the build-up of the intermodulation distortion in the filter.

24 Claims, 20 Drawing Sheets

OTHER PUBLICATIONS

F. Krummenacher, N. Joehl, "A 4-MHz CMOS Continuous-Time Filter with On-Chip Automatic Tuning," IEEE Journal of Solid-State Circuits, vol. 23, No. 6, pp. 750-758, 1988.

C. S. Park and R. Schaumann, "Design of a 4-MHz Analog Integrated CMOS Transconductance- C Bandpass Filter," IEEE Journal of Solid-State Circuits, vol. 23, No. 8, pp. 987-996, 1988.

V. Gopinathan, Y. Tsividis, K.-S. Tan, R. Hester, Design Considerations for High-Frequency Continuous-Time Filters and Implementation of an Antialiasing Filter for Digital Video IEEE Journal of Solid-State Circuits, vol. 25, No. 12, pp. 1368-1378, 1990.

B. Nauta, "A CMOS Transconductance-C Filter Technique for Very High Frequencies," IEEE Journal of Solid-State Circuits, vol. 27, No. 2, pp. 142-153, 1992.

G. DeVeirman, et al., "A 27-MHz Programmable Bipolar 0.05° Equiripple Linear-Phase Lowpass Filter," Proc. IEEE International Solid-State Circuit Conference, ISSCC'92, pp. 64-65, Feb. 1992.

G. DeVeiman and R. Yamasaki, "Design of Bipolar 10-MHz Programmable Continuous Time 0.05° Equiripple Linear Phase Filter," IEEE J. Solid-State Circuits, vol. 27, No. 3, pp. 324-331, 1992.

J. Parker, K. Current, and S. Lewis, "A CMOS Continuous-Time NTSC- to-Color-Difference Decoder," IEEE Journal of Solid-State Circuits, vol. 30, No. 12, pp. 1524-1532, 1995.

A. Wyszynski, P. van Halen, "60 MHz Common-Mode Self-Tuned Continuous-Time Filter for Mass-Storage Applications," Proc. IEEE International Solid-State Circuits Conference, ISSCC'95, pp. 214-215, Feb. 1995.

W. B. Kuhn, F. W. Stephenson, A. Elshabini-Riad, "A 200 MHz CMOS Q-Enhanced LC Bandpass Filter," IEEE Journal of Solid-State Circuits, vol. 31, No. 8, pp. 1112-1122, 1996.

S. Pipilos, Y. Tsividis, J. Fenk, Y. Papananos, "A Si 1.8 GHz RLC Filter with Tunable Center Frequency and Quality Factor," IEEE Journal of Solid-State Circuits, vol. 31, No. 10, pp. 1517-1525, 1996.

W. Kuhn, N. Yanduru, and A. Wyszynski, "Q-Enhanced LC Bandpass Filters for Integrated Wireless Applications," IEEE Transactions on Microwave Theory and Techniques, vol. 46, No. 12, pp. 2577-2586, 1998.

D. Li, Y. Tsividis, "A Loss-Control Feedback Loop for VCO Indirect Tuning of RF Integrated Filters," IEEE Trans. On Circuits and Systems-II: Analog and Digital Signal Processing, vol. 47, No. 3, pp. 169-175, 2000.

S. Sim R. Kuhn, B. Pflaum and C. Muschallik, "Three-Band Tuner for Digital Terrestrial and Multistandard Reception," IEEE Trans. On Consumer Electronics, vol. 48, No. 3, pp. 709-717, 2002.

D. Li, Y. Tsividis, "Design Techniques for Automatically Tuned Integrated Gigahertz-Range active LC Filters," IEEE Journal of Solid-State Circuits, vol. 37, No. 8, pp. 967-977, 2002.

* cited by examiner

SELF-TUNED ACTIVE BANDPASS FILTERS

TECHNICAL FIELD OF THE INVENTION

The present invention relates to fully-integrated continuous-time active real bandpass filters and their automatic frequency- and Q-tuning systems.

BACKGROUND OF THE INVENTION

Nearly all practical transceivers require some form of filtering. Up to the date, a majority of their radio-frequency (RF) and intermediate-frequency (IF) bandpass (BP) filters are realized as off-chip ceramic or surface-acoustic wave (SAW) devices. These devices do not have a practical way to change their center frequency (CF) and/or their bandwidth (BW).

In cases when a BP filter is required to change its CF and/or its BW discrete component solutions are used that apply varactors as tunable capacitors that together with external coils (inductors) allow to tune the filter CF. Since the off-chip filter components can easily pick up noise and radio interference they need to be shielded by a metal can. This requirement unavoidably increases the cost and dimensions of the transceiver module.

Widely tunable LC BP filters for applications operating at few tens of MHz are not easy to integrate on-chip because of the prohibitively large physical size of the required on-chip inductors. Moreover, their tuning range is limited by that of the varactors that varies form a few to few tens of percent, which may not be adequate for applications such as TV tuners, where hundreds of percent of CF change is required. Additionally, due to limited Q-factors of on-chip inductors and varactors the active Q-enhancement schemes must be added that further limit the filter noise and distortion performance and the resulting dynamic range (DR). Such schemes also increase the filter power consumption. Finally, the viable at high-frequency BP filter synthesis methods such as mutually coupled resonators suffer from the asymmetry of the transfer function due to frequency dependent loss of resonators as well as to parasitic C couplings. Moreover, for these class of circuits the Q-tuning often fails due to instability or lack of convergence unless special techniques are applied.

It would be much more convenient if a BP filter was realized in a pure active technique such as in $g_m$-C, active R-C, MOSFET-C, $g_m$-active-C or other, to improve its tunability range and to obtain a flat symmetrical transfer function. It is not uncommon to achieve a tuning range in excess of 1000 percent when using one of these techniques. This class of circuits is also free form Q-tuning problems typical for Q-enhanced LC mutually coupled resonators. However, the noise, distortion, the resulting DR and power consumption are all worse than that of LC Q-enhanced BP filters.

Another obstacle in the integration of RF filters is the need to adjust their CF and their Q-factors. The accuracy problems of the required tuning systems may result in the whole filter not meeting the stringent system specifications over process, voltage supply and temperature variation (PVT). Due to the matching errors between the Master and Slave the most frequently used indirect tuning, or Master-Salve (M-S) schemes suffer from significant accuracy errors up to 5% for CF and up to several tens of percent for Q-factor. Naturally, for majority radio applications such a modest accuracy is not acceptable. Additionally, the reference feed-through degrades the overall noise performance of the filter. The typically achievable S/N ratio for an active filter tuned with a M-S scheme is about 40 dB.

In the case of presented BP filters instead of using the M-S scheme the tuning accuracy can be substantially improved by directly tuning the filter as a self-tuned filter or as a self-tuned with common-mode (CM) signals filter as shown in U.S. Pat. No. 5,608,665 by passing the CM reference through the filter while simultaneously processing the differential signal. The simplest configuration is obtained by two single-ended structures forming a pseudo-differential filter. Because these tuning schemes are free from the M-S matching errors the expected accuracy of self-tuned frequency- and Q-tuning systems could be as good as 0.5% and 2% respectively.

DESCRIPTION OF THE PRIOR ART

The architecture of a classical Master-Slave (M-S) tuning scheme such as one described in U.S. Pat. No. 3,997,856 is illustrated in FIG. 1, and is identified by the numeral 10. Note that only a frequency-tuning scheme is presented in U.S. Pat. No. 3,997,856. The Q-tuning scheme is not disclosed in that patent. The frequency-control scheme consists of a Master filter, or a Master oscillator 12 followed by a frequency-tuning circuit 14 similar to that of U.S. Pat. No. 3,997,856. It is illustrated in FIG. 2 and identified by the numeral 20. It consists of a pair of limiters 21, a phase-detector 22, which can be a multiplier or an XOR gate, a differential amplifier 23 and a lowpass filter 24. Another possibility is to use all-digital phase-detector scheme, which is illustrated in FIG. 3 and identified by the numeral 30. It consists of a pair of limiters 31, a phase/frequency-detector 32, a charge pump 33, and a lowpass filter 34. If a large reference amplitude is a concern, in order to lower the reference feedthrough a different frequency-tuning circuit illustrated in FIG. 4, and identified by the numeral 40, can be applied. It consists of a $g_m$-C integrator 41, a pair of peak-detectors 42 and a differential amplifier 43. The principle of operation of this circuit relies on the detection of the unity gain of a $g_m$-C integrator 41. The frequency of the Slave filter 18 is adjusted by controlling the $g_m$'s of the filter with the same control voltage as the Master $g_m$-cell in the integrator 41. The Q-control scheme in FIG. 1 consists of a Master filter, or a Master oscillator 12 followed by the Q-tuning circuit 16. It is illustrated in FIG. 5, and identified by the numeral 50. It consists of a pair of peak detectors 51, a differential amplifier 52 and a lowpass filter 53. Since the frequency- and Q-control loops directly control the Master filter 12 and not the Slave filter 18 in FIG. 1, due to unavoidable on-chip matching errors the expected accuracy of the M-S frequency scheme could be as low as 5% for frequency-tuning and up to several tens of percent for Q-tuning.

The architecture of a typical filter wafer-probe trimming scheme is illustrated in FIG. 6, and is identified by the numeral 60. It consists of the $g_m$-C oscillator circuit 62 with its output connected to the first input of the frequency-control circuit 64, similar to that in FIG. 2 or FIG. 3. The frequency reference is applied to the second input of the frequency-control circuit 64. The output signal of the frequency-control circuit 64 is simultaneously applied to the $g_m$-controlling nodes of the oscillator circuit 62 and the Slave filter 66. During the one-time wafer-probe procedure the oscillation frequency is measured and compared to the frequency reference. The resulting error signal is used by a negative feedback loop to adjust the $g_m$ of the oscillator, which is built with the same $g_m$-amplifiers as the tuned filter. After the filter $g_m$-amplifiers are adjusted and their $g_m$-value is fixed the oscillator and the rest of the trimming circuitry are disabled and the $g_m$-amplifiers and the filter frequency track the temperature with the temperature independent biasing. The accuracy of the wafer-probe scheme is expected to be worse than that of the M-S scheme. The reason is that while initially the wafer-probe scheme demonstrates the accuracy similar to that of the M-S, after the Master is disabled its accuracy relies entirely on the temperatures insensitive biasing. Since such biasing introduces an extra error by not perfectly tracking the temperature variations the frequency-tuning accuracy of the wafer-probe scheme can be as low as 10%, which is still useful for some less demanding applications. However, because of this low accuracy, the Q-tuning is not practical here.

The architecture of a self-tuned filter scheme is illustrated in FIG. 7, and it is identified by the numeral 70. It consists of two filters 71 and 72. When the first of filters 71 and 72 has its input connected to the input signal the other one is tuned with the reference. Then using switches 73 and 74, their roles are interchanged. The outputs of filters 71 and 72 are switched using switches 75 and 76. The frequency reference is applied to the frequency-tuning circuit 79 that generates control signals via hold circuits 77 and 78 for tuning the one of the filters 71 and 72 that is not processing the input signal. The critical difficulty of this scheme is switching the filters on and off the signal such that transients are avoided. For this reason this architecture is not practical. However, if it was not for this problem the self-tuning has the potential of achieving higher-accuracy than that of a M-S scheme.

The architecture of a CM self-tuned filter scheme of U.S. Pat. No. 5,608,665 is illustrated in FIG. 8, and is identified by the numeral 80. Contrary to self-tuned architecture of FIG. 7, this filter scheme is free of switching problem. It consists of two single-ended biquad filters 81 and 82. The differential input signal enters the biquads together with a common-mode (CM) reference. If the lowpass outputs of the biquads are used for signal processing the subtractor 85 rejects the CM reference leaving free output signal. For the purpose of frequency-tuning the lowpass outputs are added by summer 84. In this case the signal is rejected leaving pure lowpass reference output to be processed by one of the frequency-tuning schemes in FIG. 2 or 3. The output from the frequency-tuning circuit is applied to the frequency-control terminals of the biquads 81 and 82. Similarly, for the purpose of Q-tuning the bandpass outputs are added by summer 83 that rejects the signal and leaves pure bandpass reference output to be processed by a Q-tuning scheme in FIG. 5. The output from the Q-tuning circuit is applied to the Q-control terminals of the biquads 81 and 82.

SUMMARY OF THE INVENTION

The present automatically-tuned active continuous-time real bandpass filter can be used in a fully integrated wideband zero-IF or low-IF receivers. Contrary to other automatically-tuned filters the present filter operates on a differential signal while simultaneously being tuned using a common-mode (CM) reference signal, which results in a superior accuracy of its center frequency and bandwidth. The present filter consists of two or more pairs of $g_m$-C or other types of active resonators that can be single-ended or differential. The two identical filters are tuned with CM reference that is rejected at the output of each resonator. For each pair of biquadratic resonators, the principle of the present frequency tuning relies on comparison between the resonators' bandpass (BP) and lowpass (LP) magnitudes at the resonant frequency. The lock condition is achieved when their values are equal. For each pair of resonators the present Q-tuning scheme adjusts the magnitude at the resonant frequency and its Q to the appropriate value. The present tuning schemes allow building a reasonably flat passband bandpass filter using two or more pairs of resonators. Additionally, since both tuning schemes rely on the amplitude detection the reference signal can be made small, which prevents the build-up of the intermodulation distortion in the filter.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 14:
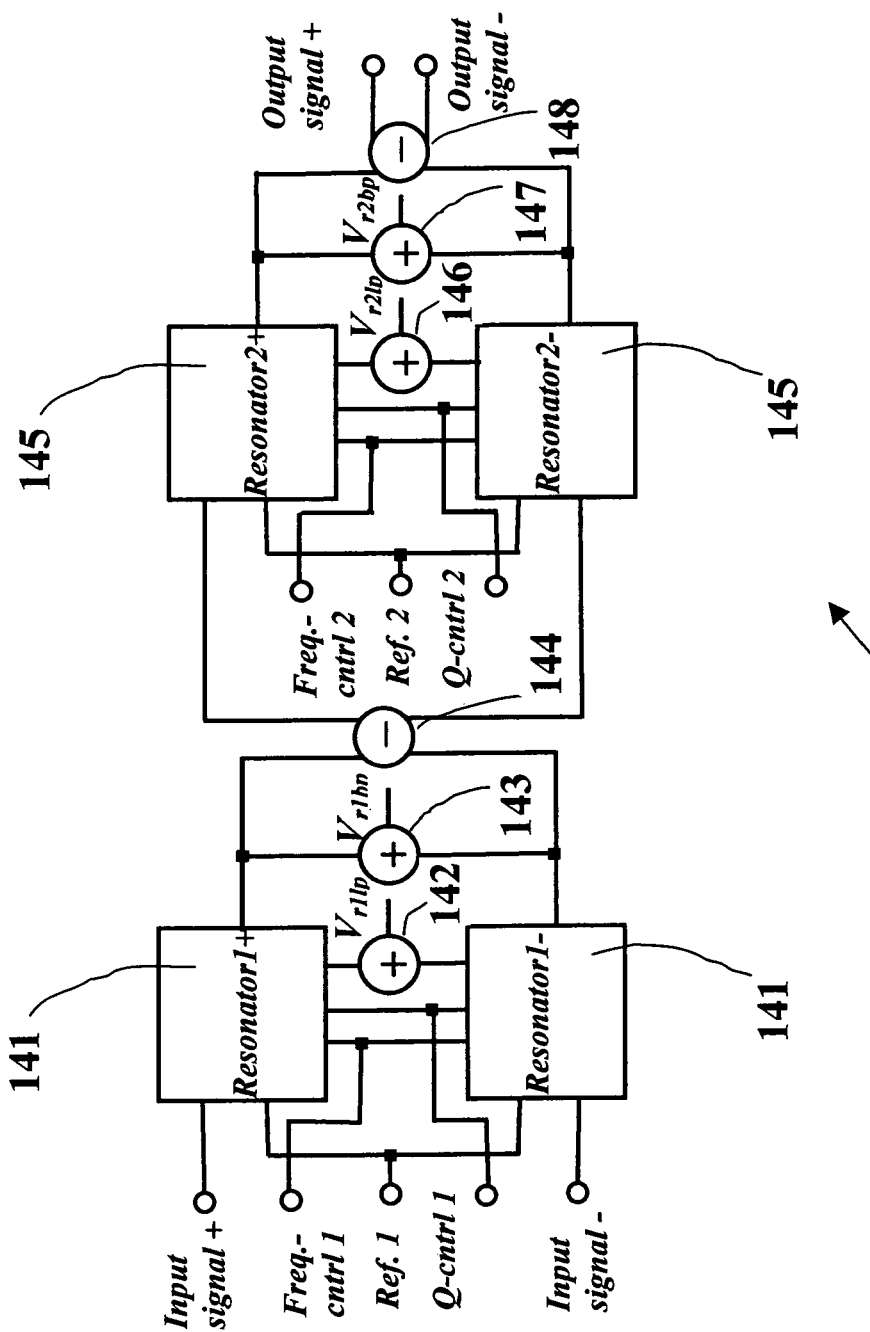
FIG. 14 is a block diagram of the present common-mode self-tuned RF BP filter.

Referring to the FIG. 14, the present automatically tuned active continuous-time real BP filter system is illustrated, and is generally identified by the numeral 140. The differential input signals and first CM-reference enter the first pair of identical single-ended resonators 141. The first resonators' lowpass (LP) outputs are connected to the summing block 142 that rejects all differential signals and interferers and passes first CM-reference only. Similarly, the first resonators' bandpass (BP) outputs are connected to the summing block 143 that rejects all differential signals and interferers and passes first CM-reference only. Next, the first resonators' BP outputs are also connected to the subtracting block 144 that rejects first CM-reference and passes all differential signals and interferers.

This differential output together with second CM-reference enters the second pair of identical single-ended resonators 145. The second resonators' LP outputs are connected to the summing block 146 that rejects all differential signals and interferers and passes second CM-reference only. Similarly, the second resonators' BP outputs are connected to the summing block 147 that rejects all differential signals and interferers and passes second CM-reference only. Next, the second resonators' BP outputs are also connected to the subtracting block 148 that rejects second CM-reference and passes all differential signals and interferers.

Referring to the FIG. 14 without losing generality, all single-ended signals in the present automatically tuned filter system 140 can be replaced with differential signals. In particular, the two single-ended input signals and two pairs of identical single-ended resonators 141,145 can be replaced with their differential versions. The single-ended CM reference can be replaced by its differential version. In such a case the summers 142, 143, 146, 147 and subtractors 144, 148 have two differential inputs and one differential output, the extracted signals become double-difference and the two references become differential signals.

Referring to the FIG. 14 without losing generality, the two-resonators 141, 145 can be replaced by three- or more resonator system. The principle of the tuning will remain the same, with additional resonators keeping their magnitudes equal to the first two resonators. Since the references should fall outside the desired band the even number of resonators is preferred to the odd number with their peak frequencies outside the desired band.

In such a case the magnitude comparison can be performed in pairs. As an illustration, for four resonators the magnitudes of first two resonators are made equal, then the magnitudes of last two resonators are made equal, and then finally the both pairs of magnitudes are made equal and that of the desired Q-value.

Figure 15:
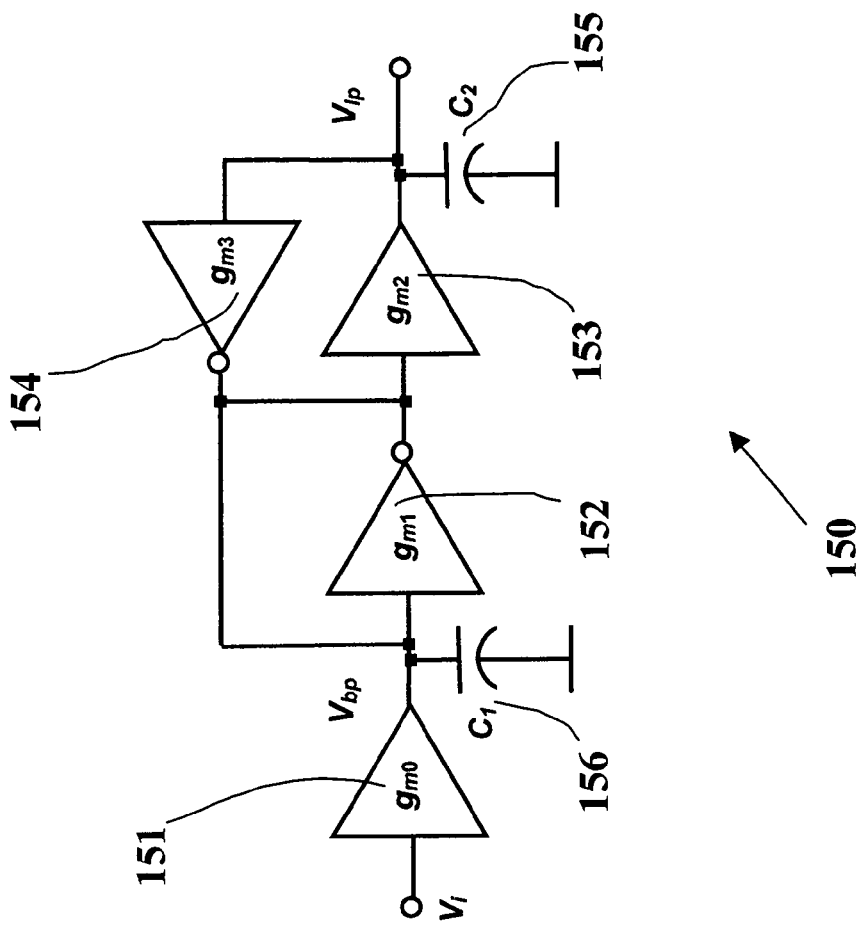
FIG. 15 is a block diagram of a single-ended $g_m$-C biquadratic resonator.

The biquadratic resonators can be built with $g_m$-C integrators, active R-C integrators, MOSFET-C integrators, $g_m$-active-C integrators, Q-enhanced LC resonators or other active resonator design method. A single-ended $g_m$-C resonator is illustrated in FIG. 15 and is generally identified by the numeral 150. It consists of four $g_m$-cells with $g_{m0}$ cell 151 serving as a voltage-to-current converter, $g_{m1}$ cell 152 serving as a load resistor defining the resonator's Q, and $g_{m2}$ cell 153 with $g_{m3}$ cell 154 forming a gyrator that with capacitor $C_2$ 155 simulates an inductor. Capacitor $C_1$ 156 resonates with an active inductance of the gyrator. To boost the resonator's Q and to lower its noise $g_{m1}$ cell 152 can be omitted and the resonator loss is the sum of the output conductance of $g_{m0}$ cell 151 and $g_{m3}$ cell 153. In such a case, despite of worse tracking by output conductances as opposed to $g_{m1}$ the frequency and Q- accuracy are still maintained by automatic tuning systems.

The BP and LP transfer functions of the $g_m$-C resonator in FIG. 15 can be derived as:

$$H_{BP}(s) = \frac{s\frac{g_{m0}}{C_1}}{s^2 + s\frac{g_{m1}}{C_1} + \frac{g_{m2}g_{m3}}{C_1C_2}} \quad (1)$$

$$H_{LP}(s) = \frac{\frac{g_{m0}g_{m2}}{C_1C_2}}{s^2 + s\frac{g_{m1}}{C_1} + \frac{g_{m2}g_{m3}}{C_1C_2}} \quad (2)$$

with their resonant frequency $\omega_o$ and the quality factor Q defined as:

$$\omega_o = \sqrt{\frac{g_{m2}g_{m3}}{C_1C_2}} \quad (3)$$

$$Q = \sqrt{\frac{g_{m2}g_{m3}C_1}{g_{m1}^2 C_2}} \quad (4)$$

From the Q formula it is seen that the highest achievable Q is obtained when $g_{m1}$ is replaced by the sum of output conductances $g_{o0}+g_{o3}$, which are much smaller than $g_{m1}$. Depending on the technology parameters and the design details the resonator Q's in the order of ten to fifty can be achieved.

Figure 16:
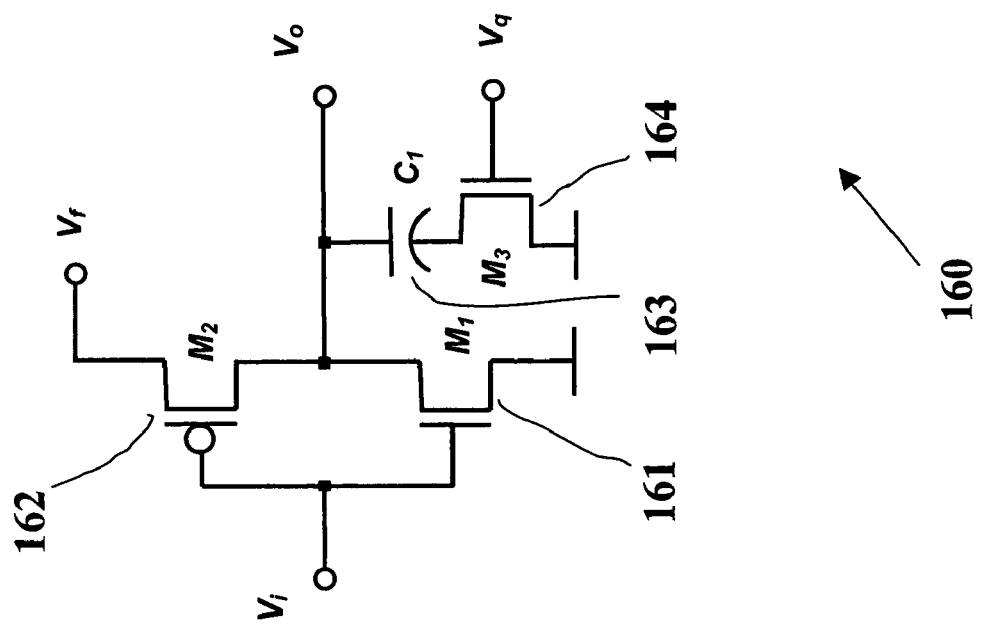
FIG. 16 is a circuit diagram of an inverter-based $g_m$-C integrator.

A single-ended $g_m$-C integrator is illustrated in FIG. 16 and is generally identified by the numeral 160. It is a building block for each of the four biquadratic resonators used in the presented filter. It consists of an inverter 161 $M_1$, inverter 162, $M_2$ and a capacitor 163 $C_1$. The transistor 164 $M_3$ serves as a series resistor that changes the phase of the integrator and modifies a Q-factor of any filter built with it. The Q-control is applied as a gate voltage $V_q$ controlling the gate voltage and the triode mode conductance $g_{ds3}$ of $M_3$. The supply voltage $V_f$ controls the unity gain frequency of the integrator and the center frequency of any resonator built with it. The device $M_1$-$M_2$ matching sets the dc-output voltage of the integrator and due to the low output impedance of submicron MOS devices it does not require a separate control. Due to the principle of CM-tuning using a common-mode feedback (CMF) circuit to control CM dc-output voltage for a pair of integrators is not an option as a CMF circuit would attenuate the CM-reference. However, standard replica bias schemes can improve the stability of the dc-output voltage if such a need arises.

The unity gain frequency of the integrator in FIG. 16 can be tuned using supply voltage $V_f$ by modifying its $g_m$-value. Using a simplified Square Law for the drain current of a MOS device in saturation $$i_D = \frac{k}{2}(v_{GS} - V_T)^2 \quad (5)$$

where $k=\mu C_{ox}$ W/L, $\mu$ is the mobility, $C_{ox}$ is the thin oxide capacitance, W is the gate width, L is the gate length, $V_{GS}$ is the gate-source voltage, and $V_T$ is the threshold voltage, its transconducance can be calculated as:

$$g_m = \frac{\partial i_D}{\partial v_{GS}} = k(v_{GS} - V_T) \quad (6)$$

The total transconductance of the integrator is calculated as:

$$g_m = g_{m1} - g_{m2} = k_n(V_{GS1} - V_{Tn}) - k_p(V_{GS2} - V_{Tp}) \quad (7)$$

which with $V_G \approx V_f/2$ becomes $$g_m = (k_n + k_p)\frac{V_f}{2} - (k_n V_{Tn} + k_p |V_{Tp}|) \quad (8)$$

and it is easily modified by changing the frequency-tuning/supply voltage $V_f$.

The phase of the integrator in FIG. 16 can be tuned using Q-control voltage $V_q$ by modifying $g_{ds3}$ value of $M_3$ with $V_{DS}$=0. Using a simplified formula for the drain current of a NMOS device in triode region $$i_D = k_n \left( v_{GS3} - \frac{v_{DS3}}{2} - V_{Tn} \right) v_{DS3} \quad (9)$$

its drain-source conductance can be calculated as:

$$g_{ds3} = \frac{\partial i_{D3}}{\partial v_{DS3}} = k(v_{GS3} - v_{DS3} - V_{Tn}) \quad (10)$$

where $V_{DS3}$ is the drain-source voltage and all other symbols have their regular meanings. Calculating the transfer function of the integrator in FIG. 16 as:

$$\frac{v_o}{v_i} = \frac{g_{m0}\left(1 + \frac{s}{z}\right)}{sC_1\left(1 + \frac{s}{p}\right)} \quad (11)$$

where p is the internal pole of the transconductor and z is the zero introduced by $g_{ds3}$ with its value $$z = \frac{g_{ds3}}{C_1} = \frac{k_n(V_q - V_{Tn})}{C_1} \quad (12)$$

for $v_{ds3}$=0. From the last two equations it is seen that with an appropriate $V_q$ the internal pole of the transconductor can be fully compensated by the introduced zero yielding the desired Q-factor for the present filter.

Referring to the FIG. 14, the recovered by summers 142, 143, 146, 147 first and second BP and LP references are processed by the present frequency- and Q-tuning circuits. Referring to the FIG. 17, the present automatic frequency- and Q-tuning systems are illustrated, and are generally identified by the numeral 170. They consist of 3 peak detectors 171, 175, a summer 172, two differential amplifiers 173 and 176 and two lowpass filters 174, 177.

Figure 9:
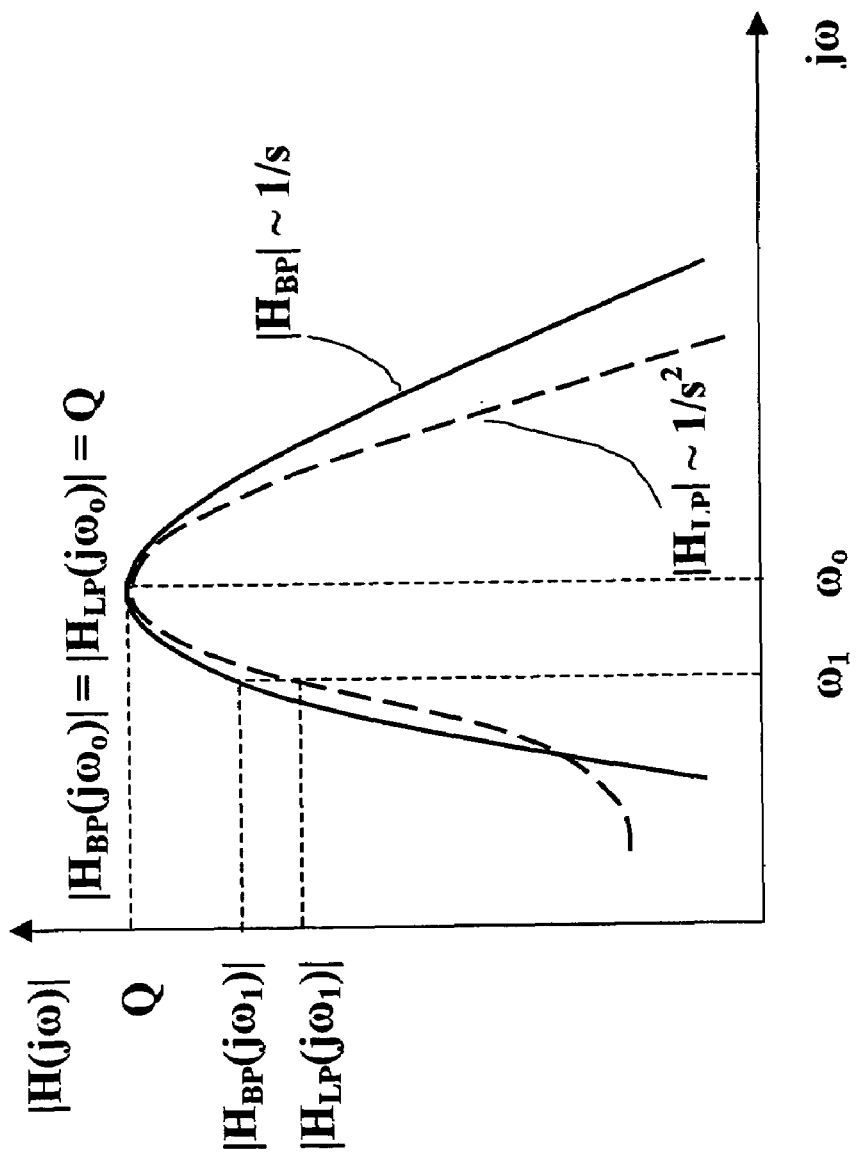
FIG. 9 shows the present resonator transfer bandpass and lowpass functions illustrating frequency-tuning process.
Figure 17:
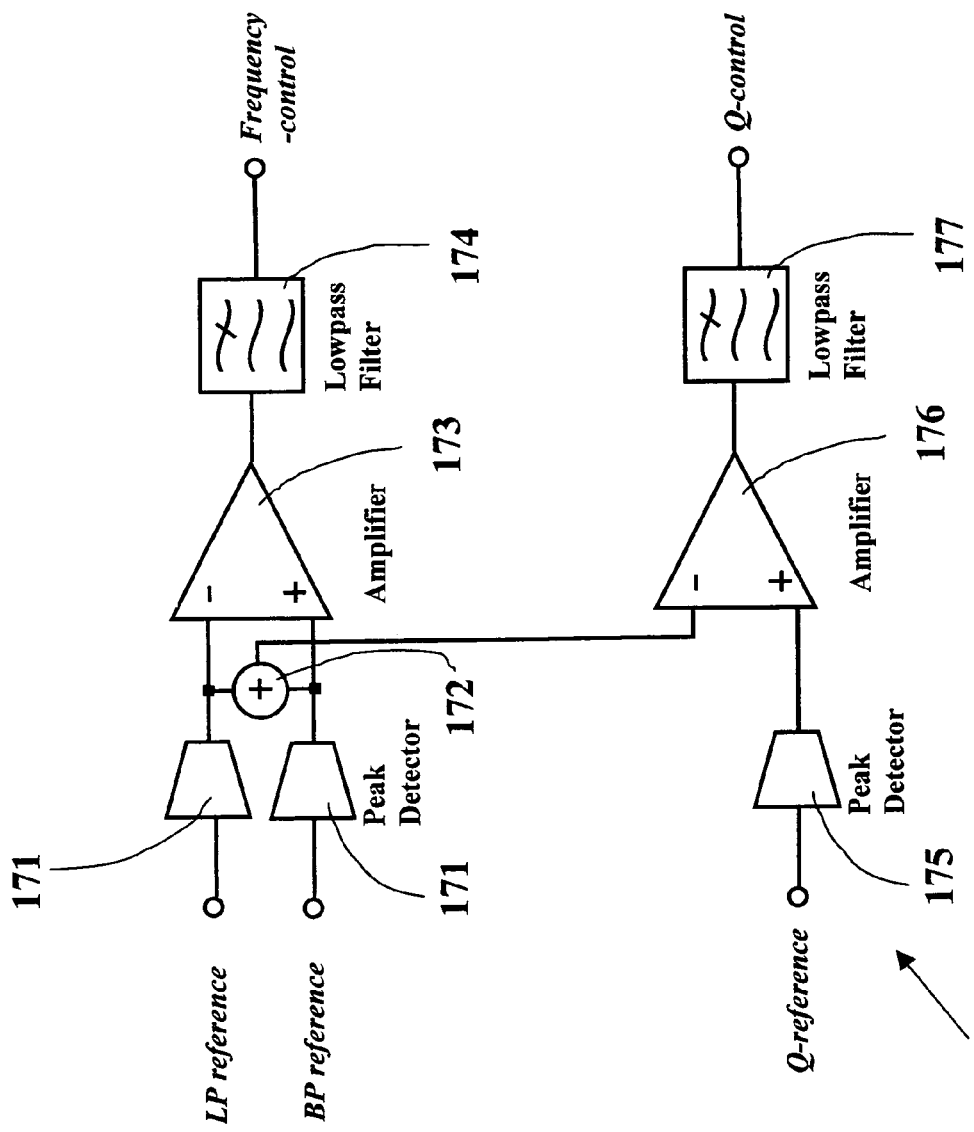
FIG. 17 is a block diagram of the present automatic frequency- and Q-tuning schemes.

Referring to the FIG. 17, the upper-part of the tuning circuitry, or the frequency-tuning system consists of blocks 171-174. As it is illustrated in FIG. 9, for each pair of resonators the frequency-tuning compares the magnitudes of BP and LP references and force them to be equal by modifying the value of the $g_m$'s of the resonator and its center frequency $\omega_o$ with the use of the control voltage $V_f$. It can be shown that for any biquad the magnitudes of BP and LP outputs at the resonant frequency $\omega_o$ are equal and their identical value is that of the biquad Q.

Writing BP and LP transfer functions for a biquad as:

$$H_{BP}(s) = \frac{s\omega_o}{s^2 + s\frac{\omega_o}{Q} + \omega_o^2} \quad (13)$$

$$H_{LP}(s) = \frac{\omega_o^2}{s^2 + s\frac{\omega_o}{Q} + \omega_o^2} \quad (14)$$

and calculating the magnitudes of BP and LP transfer functions at the resonant frequency $j\omega_o$ as:

$$|H_{BP}(j\omega_o)| = \left| \frac{j\omega_o^2}{-\omega_o^2 + j\omega_o\frac{\omega_o}{Q} + \omega_o^2} \right| = \left| \frac{j\omega_o^2}{j\omega_o\frac{\omega_o}{Q}} \right| = Q \quad (15)$$

$$|H_{LP}(j\omega_o)| = \left| \frac{\omega_o^2}{-\omega_o^2 + j\omega_o\frac{\omega_o}{Q} + \omega_o^2} \right| = \left| \frac{\omega_o^2}{j\omega_o\frac{\omega_o}{Q}} \right| = \left|\frac{Q}{j}\right|Q \quad (16)$$

it can be shown that:

$$|H_{BP}(j\omega_o)| = |H_{LP}(j\omega_o)| = Q. \quad (17)$$

Figure 10:
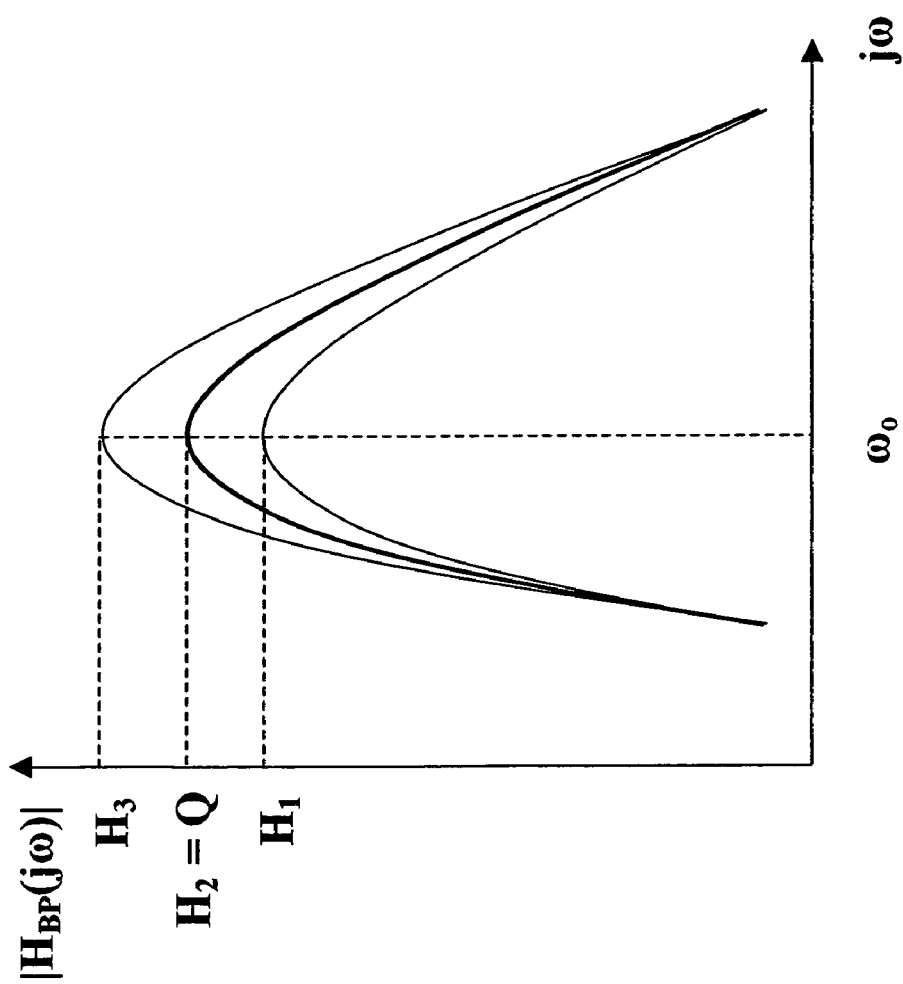
FIG. 10 shows the present resonator bandpass transfer functions illustrating Q-tuning process.
Figure 11:
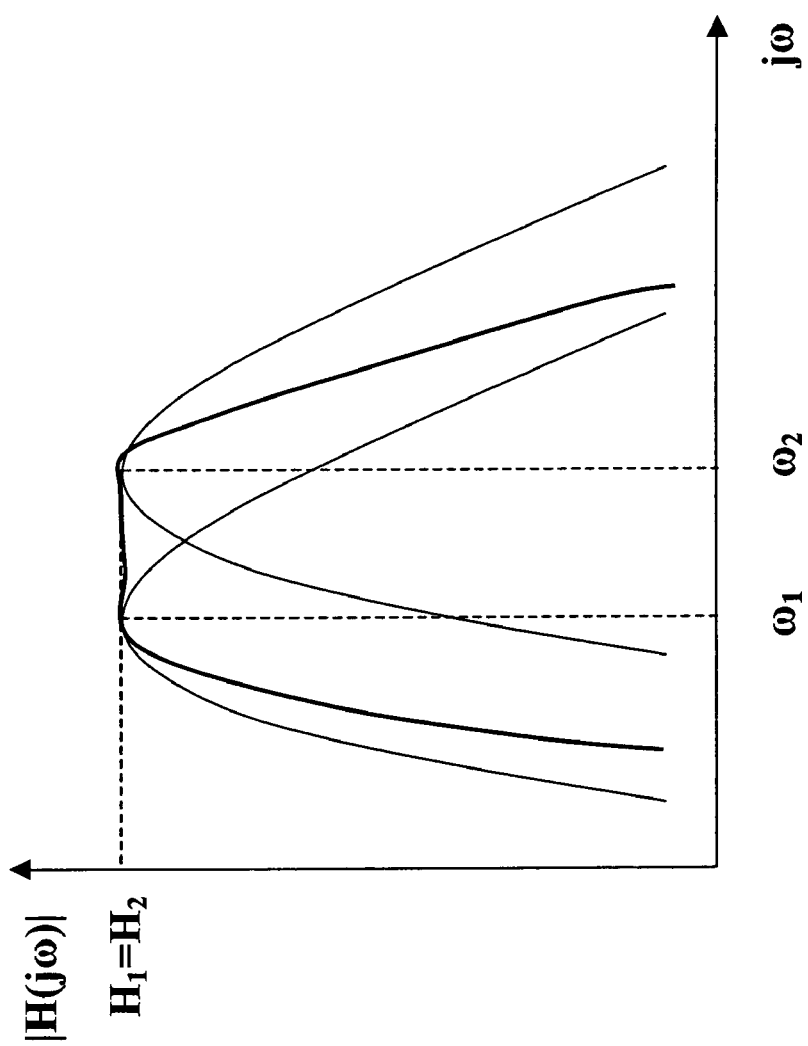
FIG. 11 shows the present overall filter flat passband transfer functions built out of two pairs of resonators.

Referring to the FIG. 17, for each pair of resonators, the summer 172 extracts the average value of the resonator CM-reference BP and LP magnitudes and passes it to the Q-tuning system consisting of blocks 175-177. Referring to the FIG. 10, it forces the average resonator magnitude value at resonant frequency $\omega_o$ to be equal to that of the particular resonator desired Q.

The present filter is directly tuned with a reference signal while simultaneously operating on the main signal. By choosing appropriate input amplitude of the reference, the reference output amplitude is set to be sufficiently small to not interfere with the main signal for a given type of signal modulation.

Figure 1:
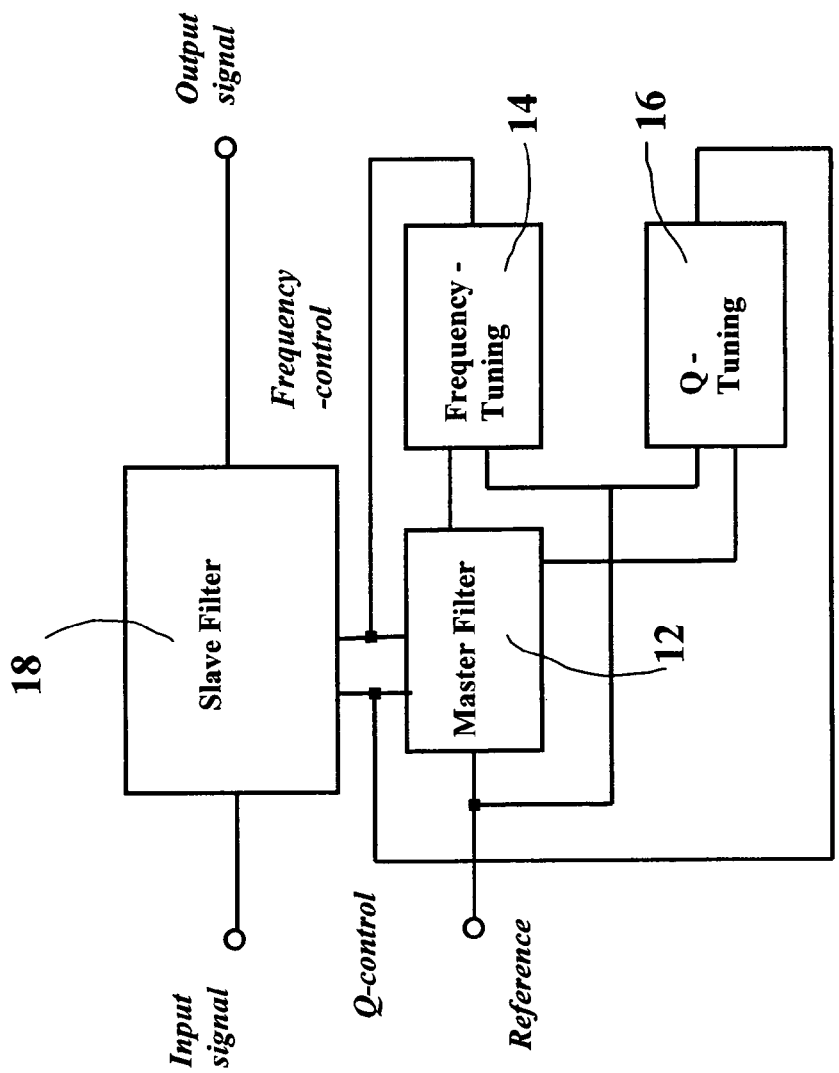
FIG. 1 is a block diagram of a prior art Master-Slave tuning scheme.
Figure 2:
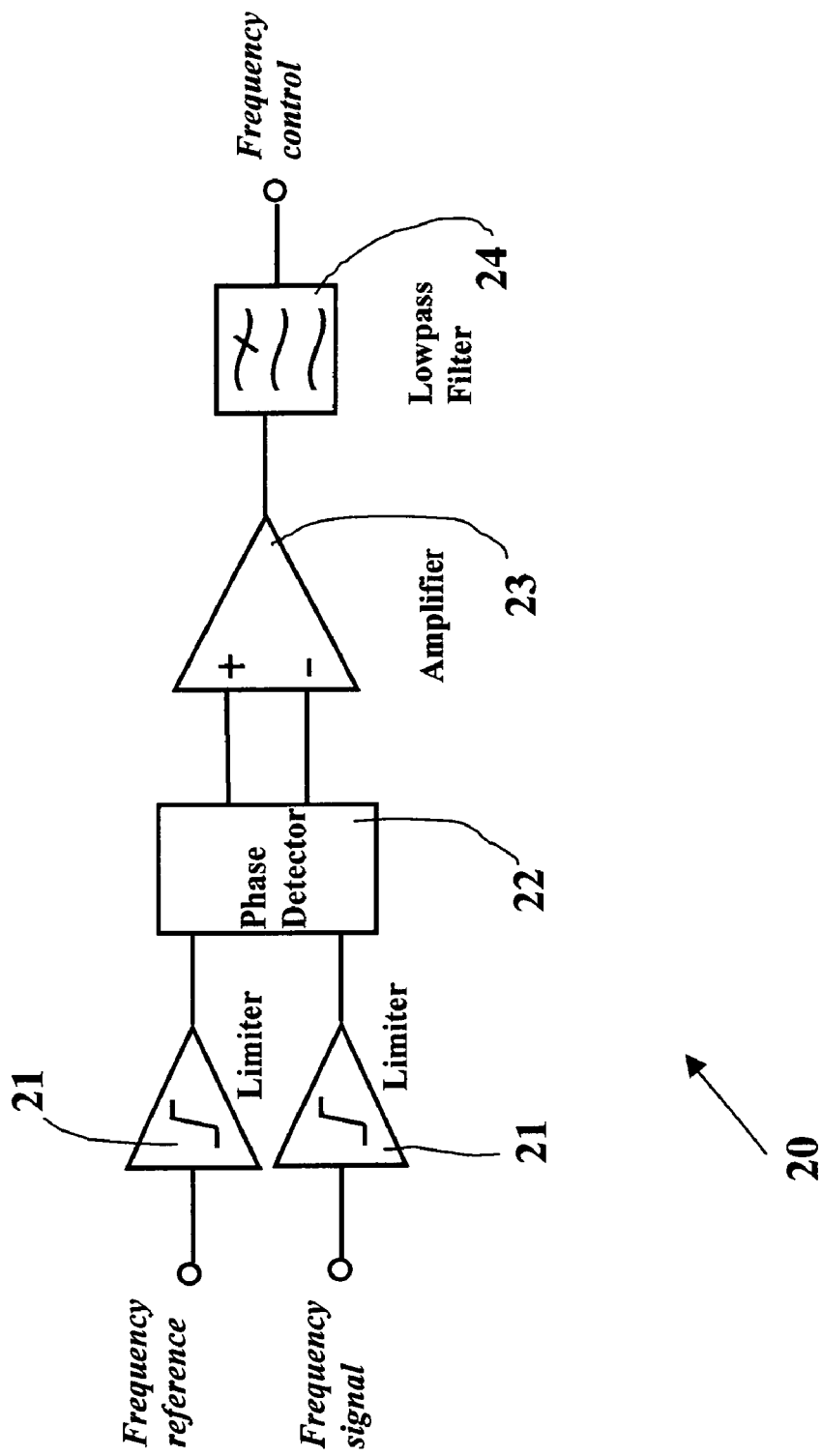
FIG. 2 is a block diagram of a prior art frequency-tuning scheme using a phase-detector.
Figure 3:
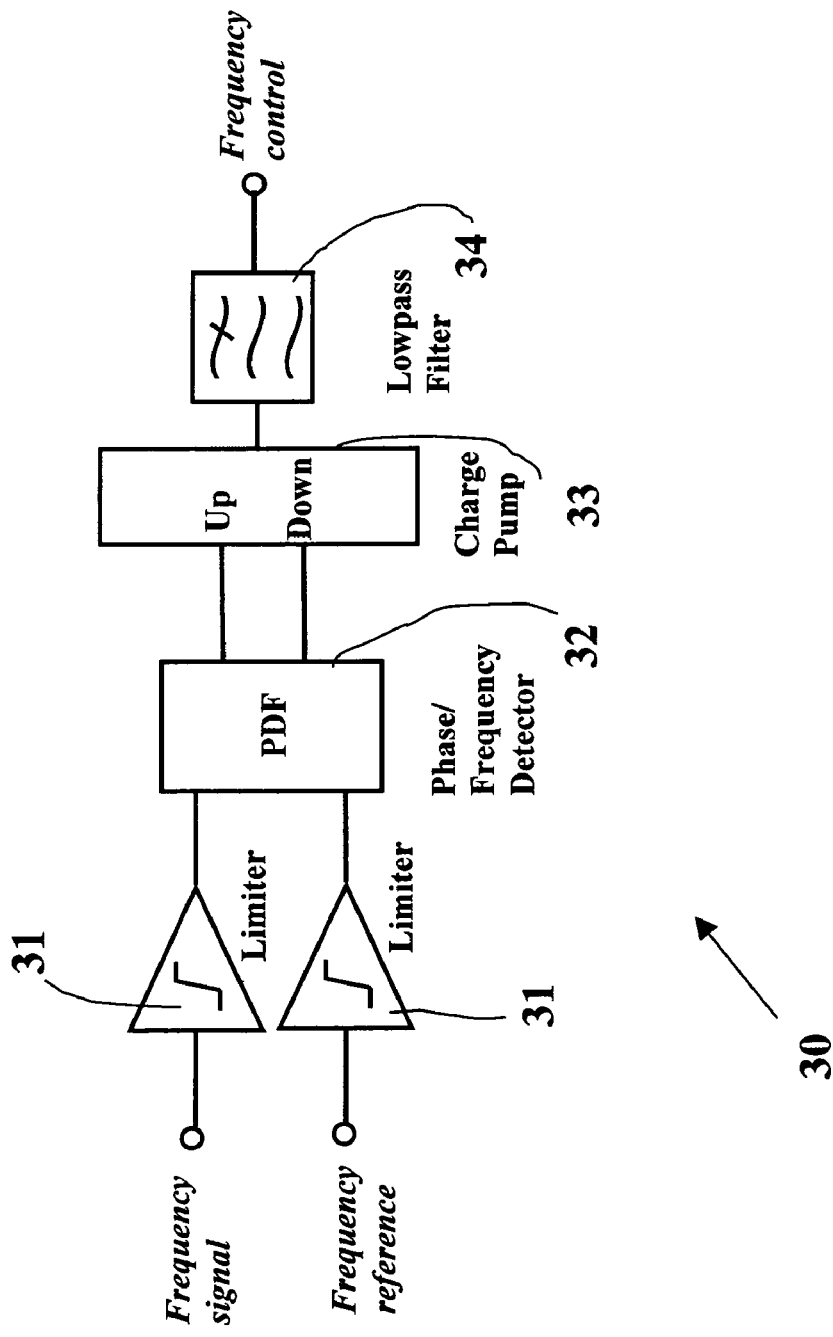
FIG. 3 is a block diagram of a prior art frequency-tuning scheme using a phase/frequency-detector.
Figure 4:
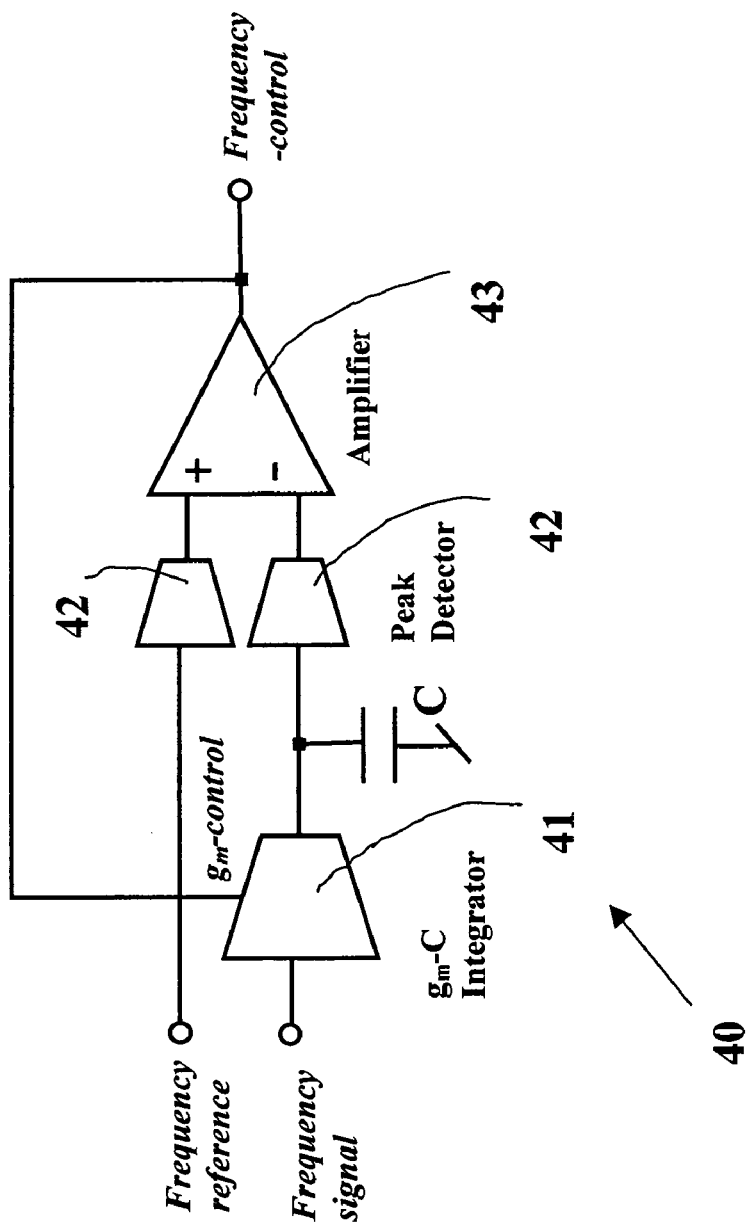
FIG. 4 is a block diagram of a prior art frequency-tuning scheme using an integrator and peak-detectors.

Any viable frequency-tuning technique including, but not limited to phase detection used in phase locked-loop Type I illustrated in FIG. 2, phase and frequency detection used in phase locked-loop Type II illustrated in FIG. 3, or amplitude detection using unity-gain integrators illustrated in FIG. 4 can be used to implement frequency-tuning circuit in FIG. 17.

Figure 5:
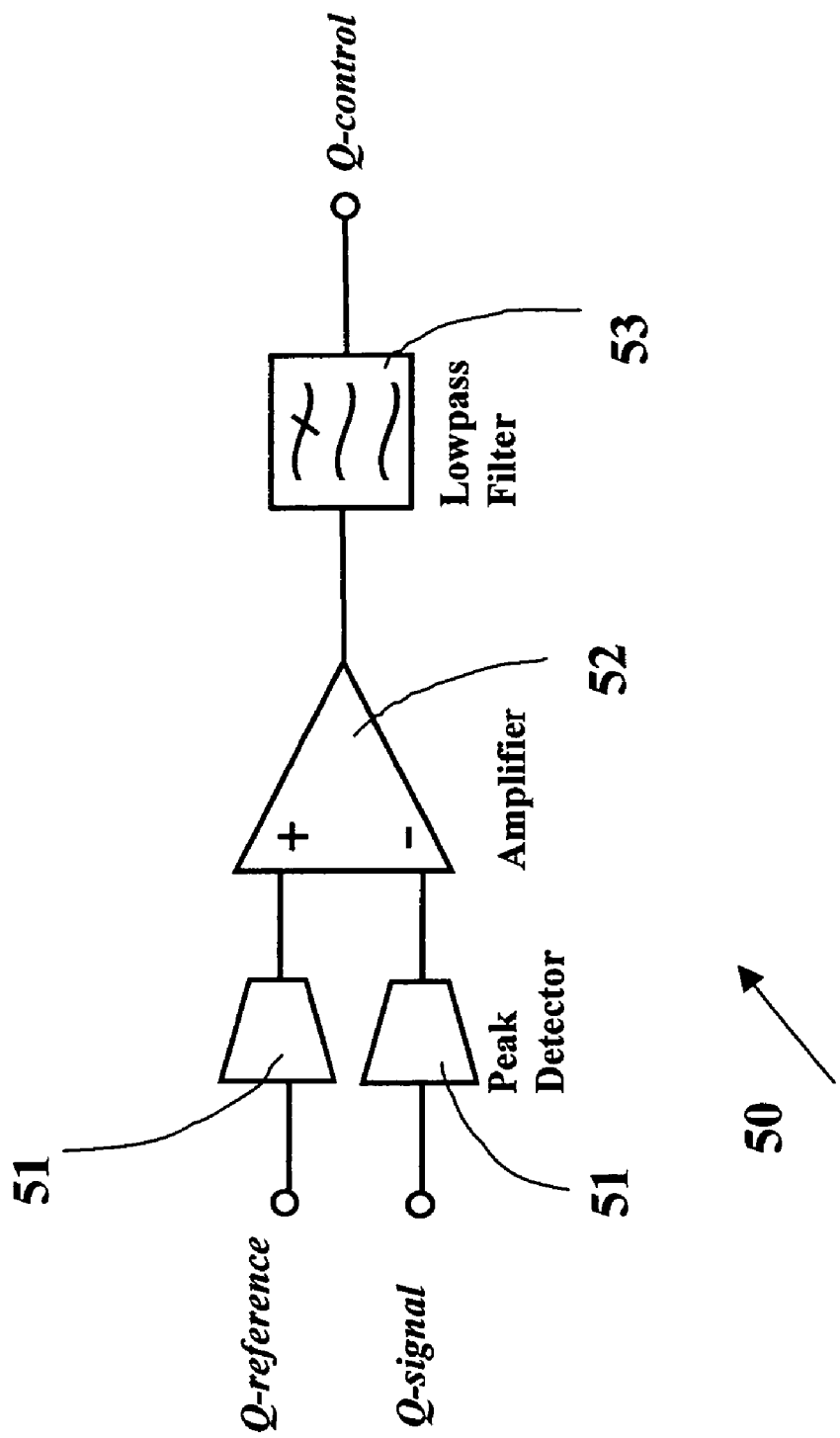
FIG. 5 is a block diagram of a prior art amplitude detection Q-tuning scheme.
Figure 6:
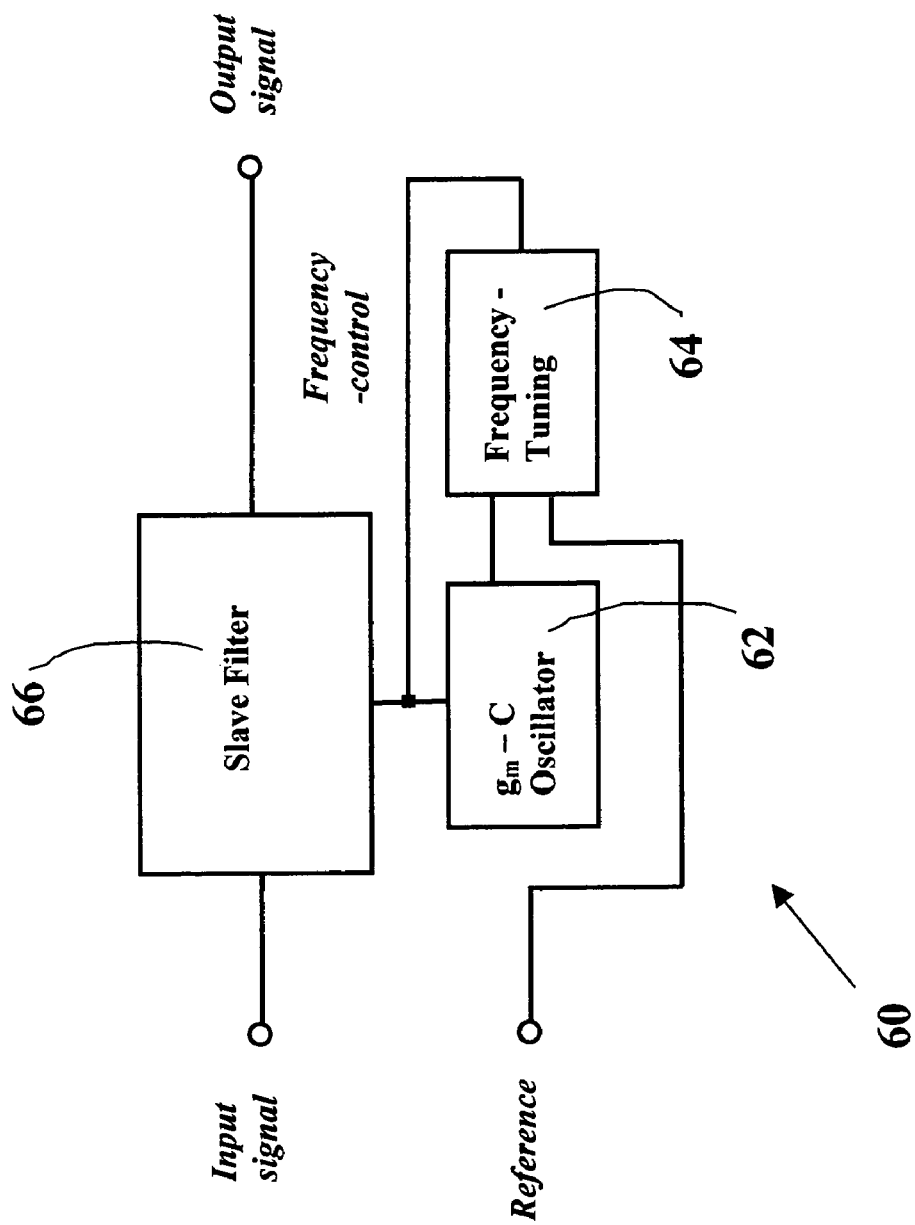
FIG. 6 is a block diagram of a prior art wafer-probing frequency-tuning scheme.
Figure 7:
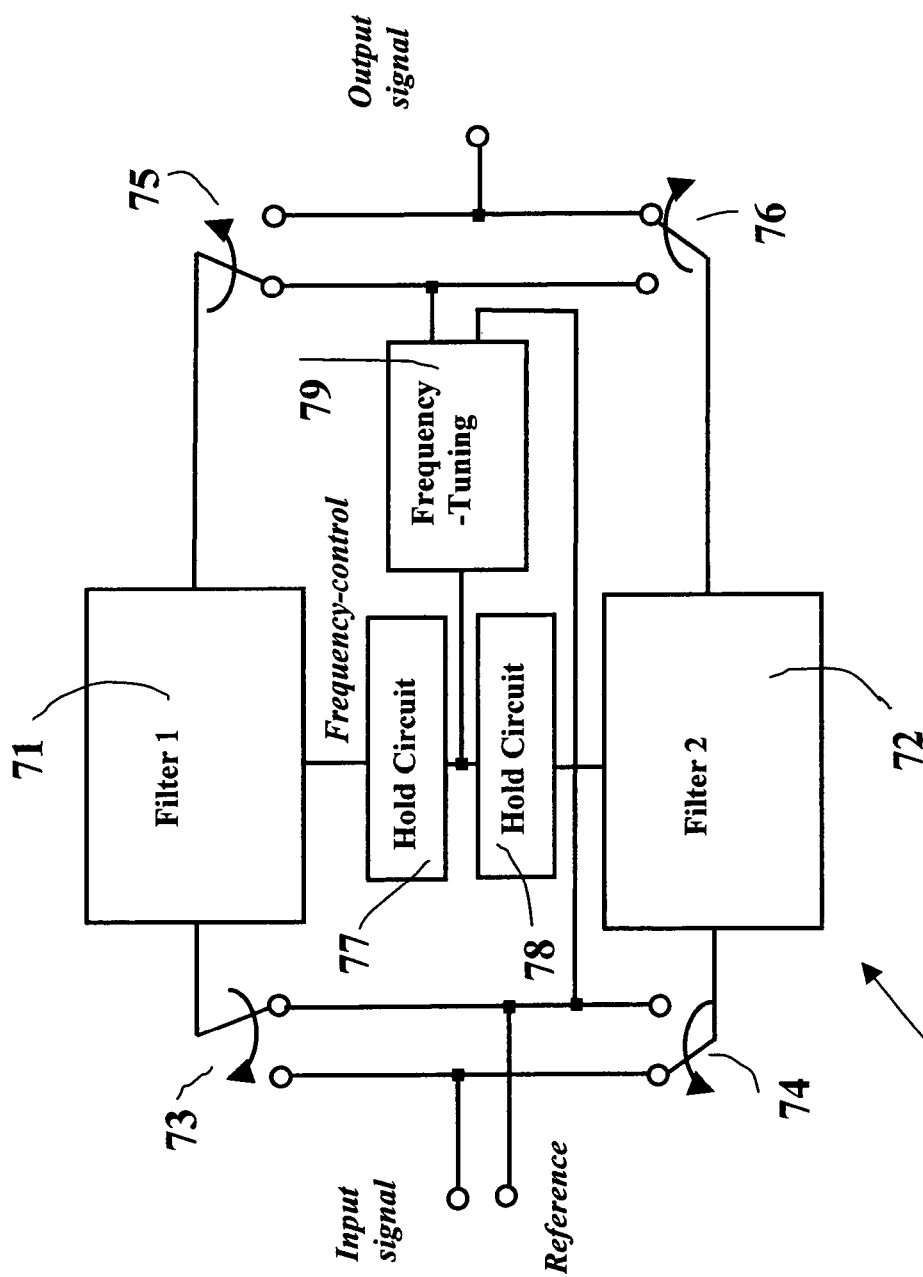
FIG. 7 is a block diagram of a prior art self-tuned switched filter.
Figure 8:
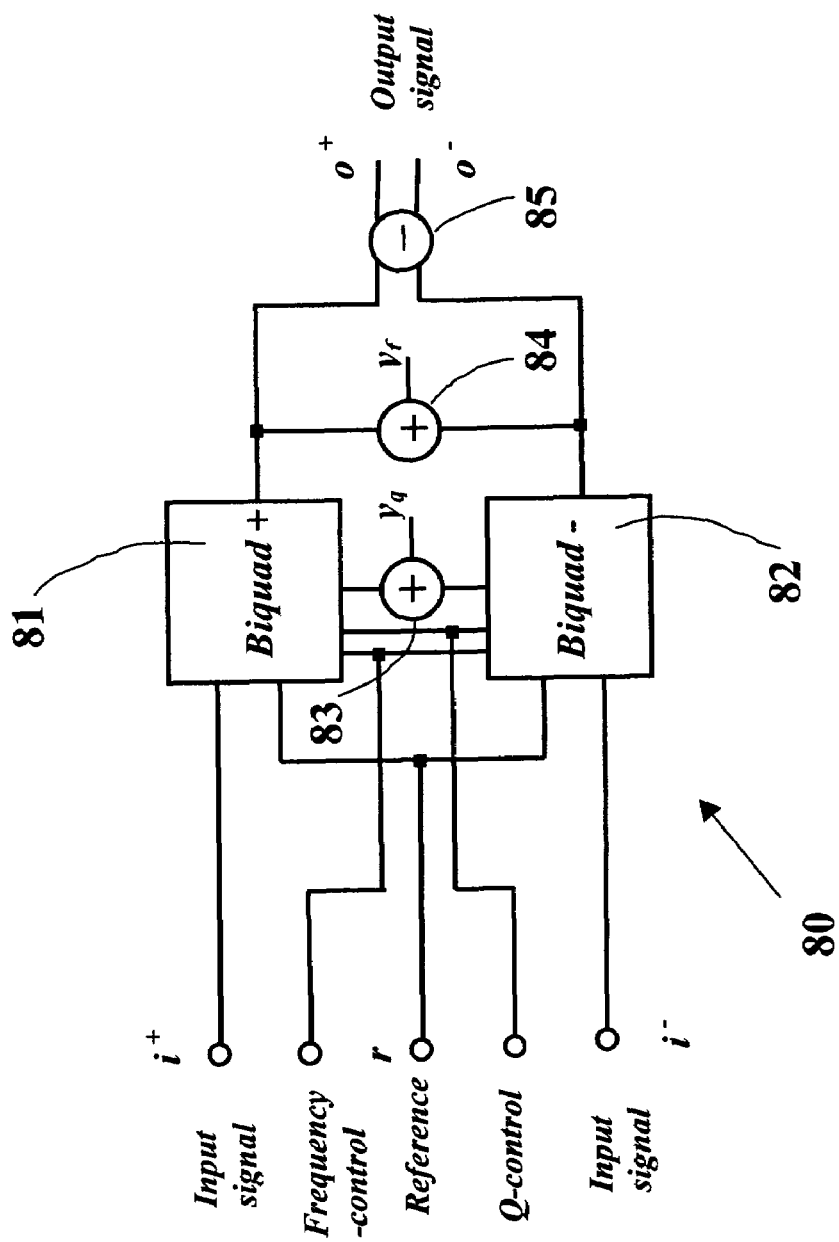
FIG. 8 is a block diagram of a prior art self-tuned with common-mode reference filter.

Any viable Q-tuning technique including, but not limited to amplitude detection using rectifiers and envelope-detectors illustrated in FIG. 5 can be used to implement Q-tuning circuit in FIG. 17.

The phase, phase/frequency, delay, or amplitude-locked loops used in frequency- and Q-tuning circuits in FIG. 17 can be analog, mixed-mode, digital or software.

Figure 12:
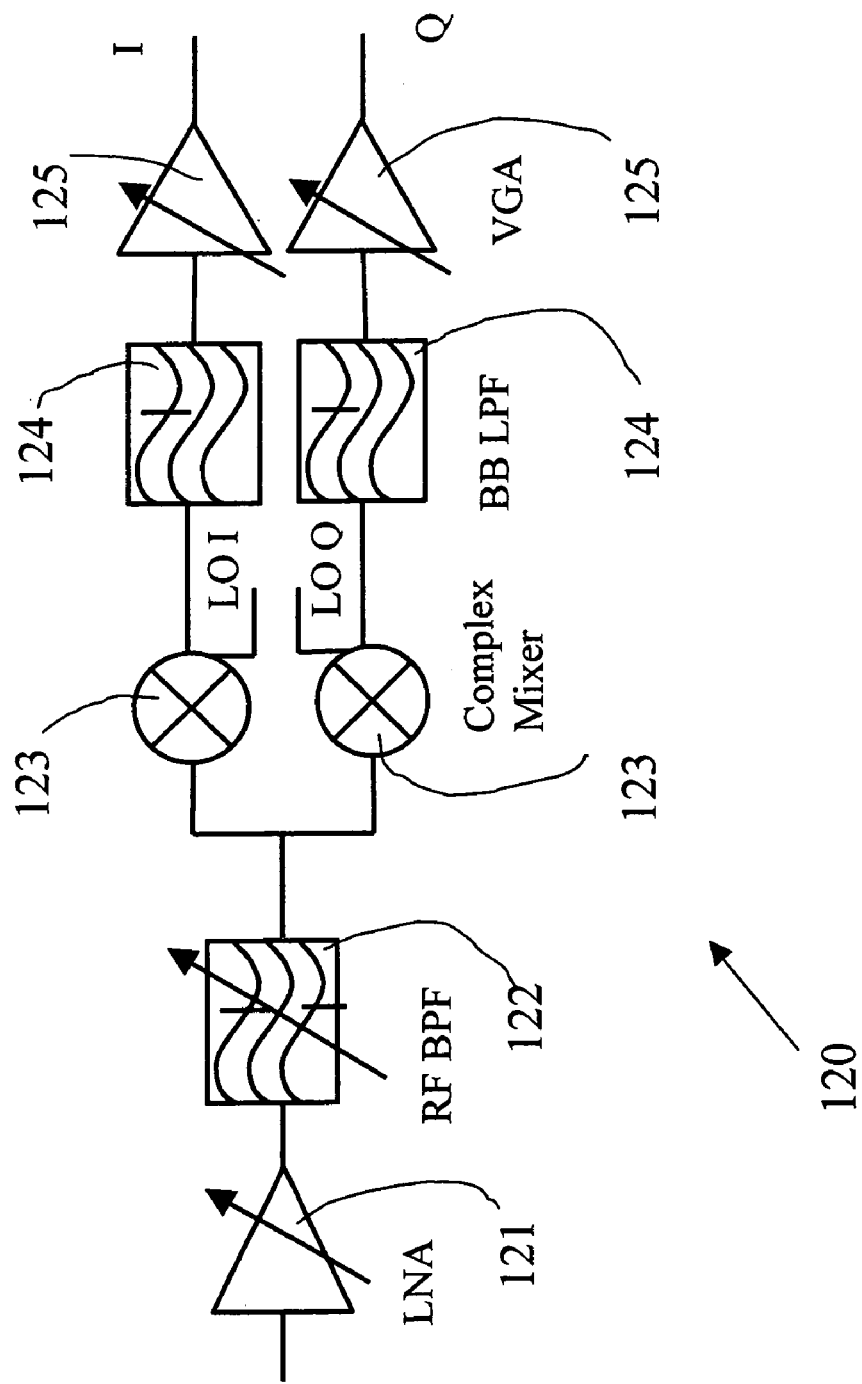
FIG. 12 is a block diagram of a fully integrated wideband zero-IF receiver using the present self-tuned RF BP filter.

FIG. 12 illustrates a fully integrated zero-IF receiver 120 using the present filter 122. The signal from the antenna enters the input of the low-noise amplifier (LNA) circuit 121, the output of which is connected to the present filter 122. The output of the present filter 122 is connected to the two inputs of the complex mixer circuit 123, which consists of two identical mixers fed by identical RF input signals and two LO signals shifted by 90 degrees (LO I and LO Q).

The complex mixer has two outputs I and Q. They connect to the inputs of the two lowpass baseband (BB LP) filters 124. Alternatively, the pair of BB LP filters can be replaced by a single complex BB LP filter, which may improve the I, Q channel matching. The I and Q outputs of filters 124 are connected to the inputs of the two variable gain amplifiers (VGA's) 125.

Figure 13:
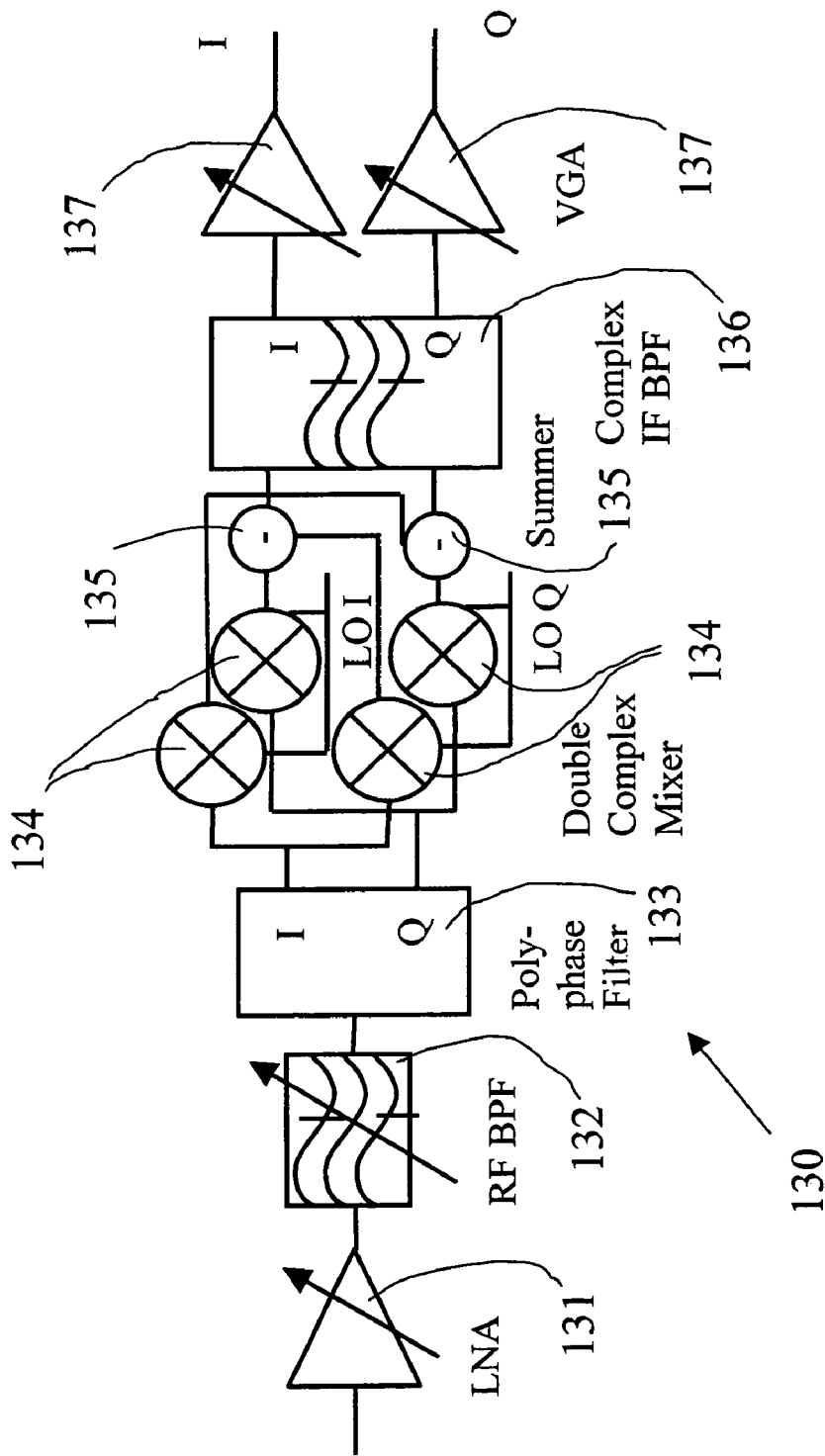
FIG. 13 is a block diagram of a fully integrated low-IF receiver using the present self-tuned RF BP filter.

FIG. 13 illustrates a fully integrated low-IF receiver 130 using the present filter 132. The signal from the antenna enters the input of the low-noise amplifier (LNA) circuit 131, the output of which is connected to the present filter 132. The output the present filter 132 is connected to the input of polyphase filter 133 that splits the RF signal into I and Q parts shifted by 90 degrees.

The I, Q outputs of the polyphase filter 133 are connected to the four inputs of the double-complex mixer circuit 134 that consists of four identical mixers fed by a pair of input I, Q RF signals shifted by 90 degrees and a pair of I, Q LO signals also shifted by 90 degrees (LO I and LO Q). The outputs of double-complex mixer are subtracted by a pair of subtractors 135, which results in canceling of image signals. The I, Q output signals form the subtractors 135 connect to the inputs of the complex IF BP filter 136 that selects the baseband channel and further rejects the image. The I and Q outputs of filter 136 are connected to the inputs of two variable gain amplifiers (VGA's) 137.

Figure 18:
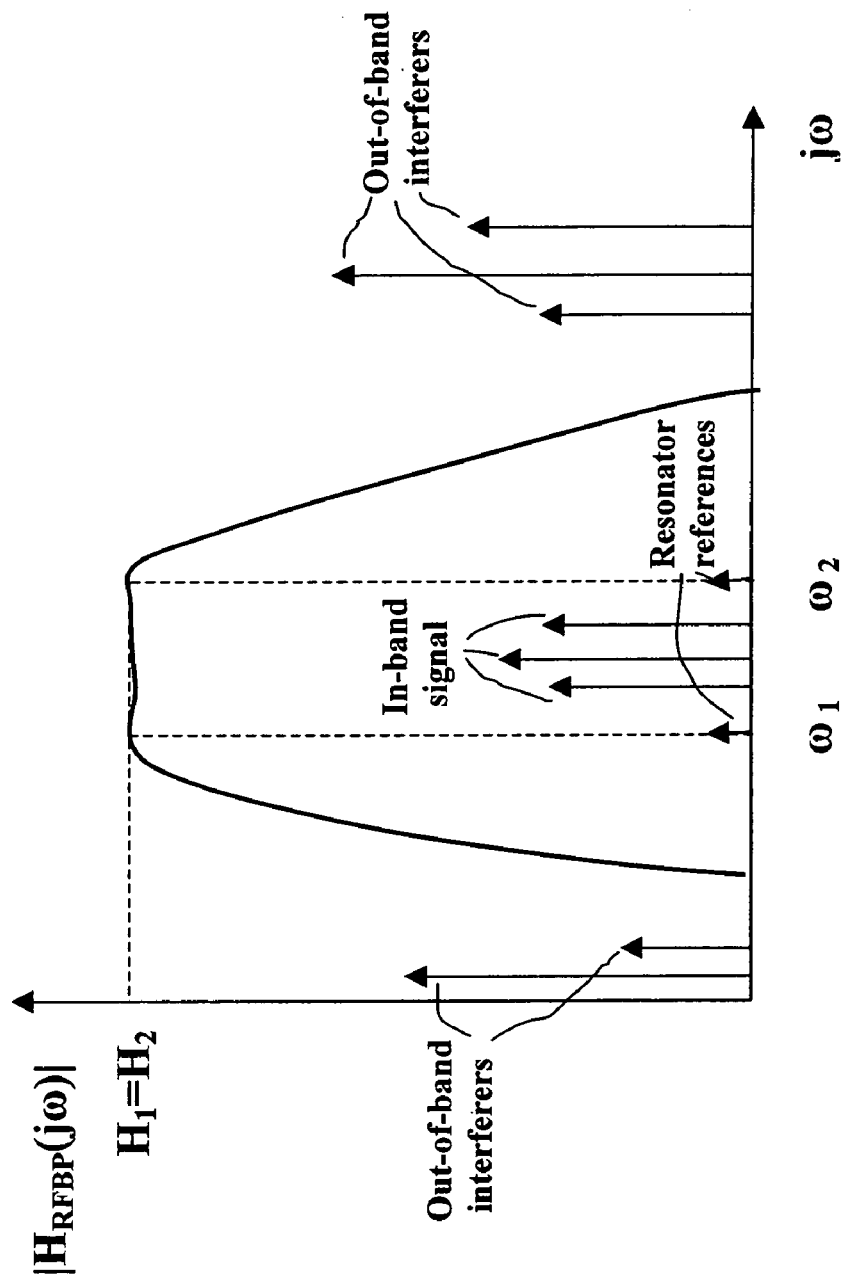
FIG. 18 shows the transfer function for the present common-mode self-tuned RF BP filter, the in-band signal, the interferers, and the two CM-references.

Referring to the FIG. 18 the present RF BP filter input spectrum of the receivers in FIGS. 12 and 13 is illustrated. Strong out-of band interferers are present on both sides of the selected spectrum. The in-band spectrum falls into the present filter passband. Note that the two CM-references also pass through the present filter passband, but they are located outside the in-band spectrum and that their amplitude is small compared to the signal.

Figure 19:
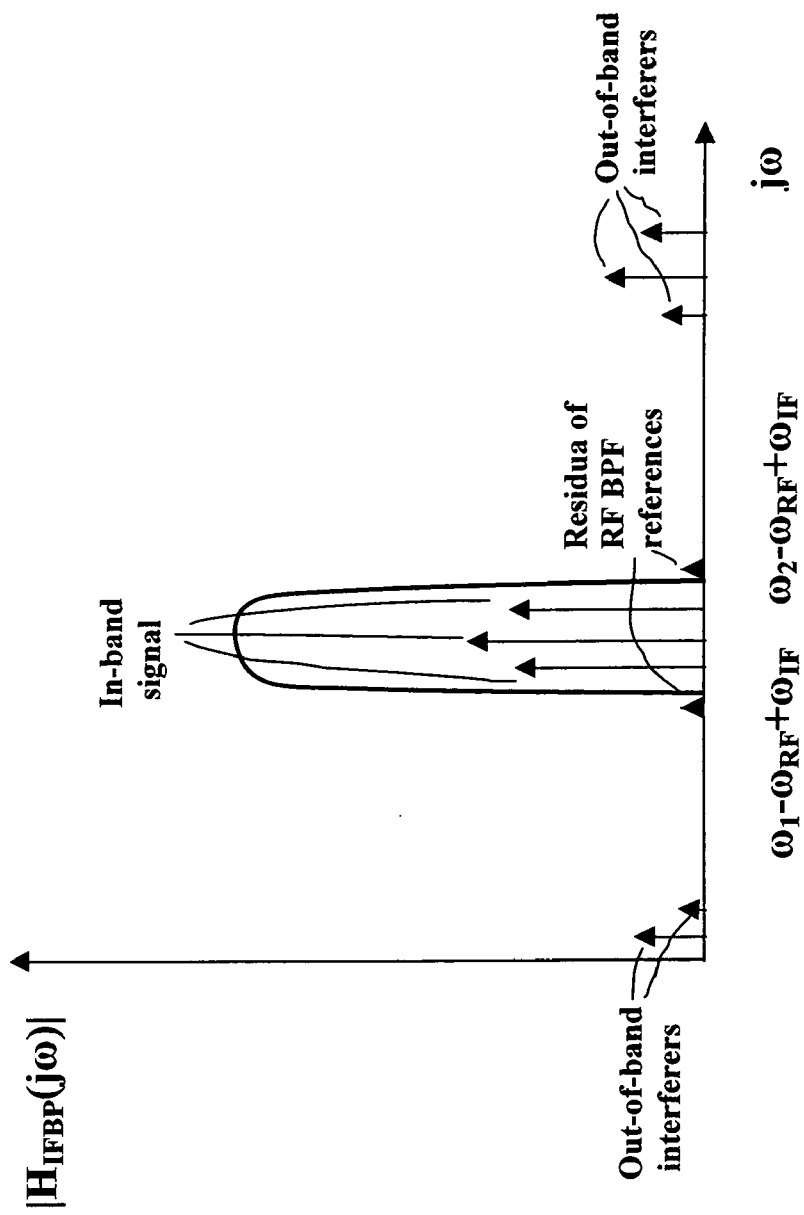
FIG. 19 shows the transfer function for the low-IF BP filter, the signal, interferers, and the residual of the two CM-references down-converted to the low-IF.

Referring to the FIG. 19 the input spectrum of the IF BP filter of the receiver in FIG. 13 is illustrated. After passing the present RF BP filter the strong out-of band interferers are substantially attenuated. The in-band spectrum falls into the IF BP filter passband. Note that the two CM-references are substantially attenuated by the CM-rejection subtractors 144, 148 in FIG. 14. They also fall outside the passband of IF BP filter.

Figure 20:
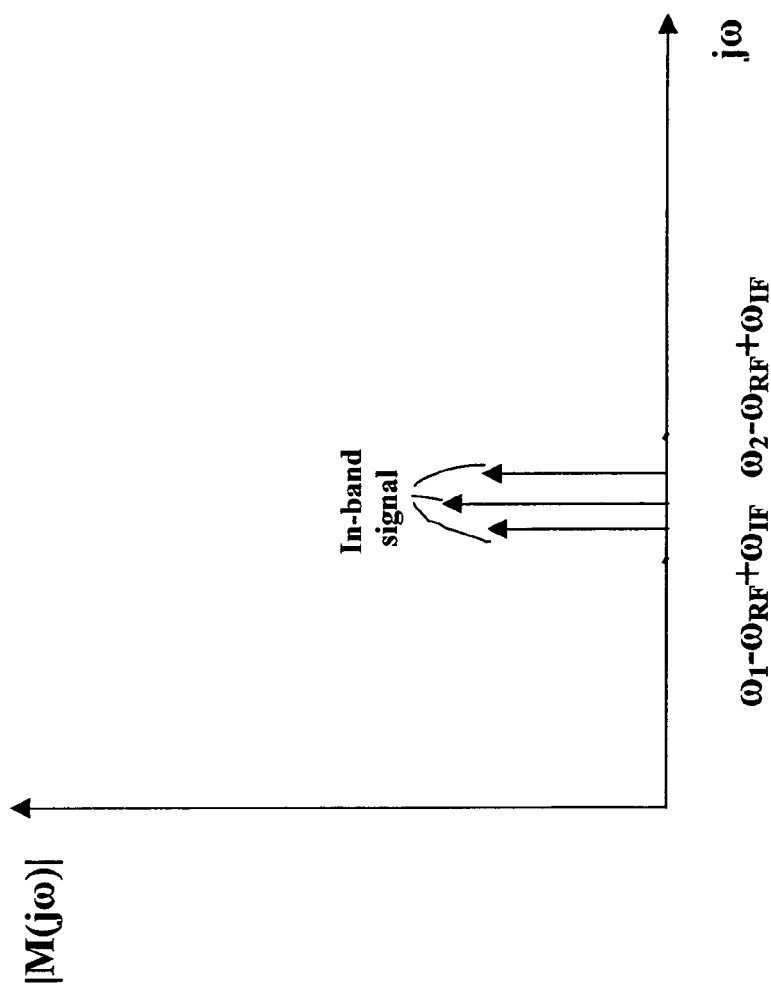
FIG. 20 shows the magnitude of the output spectrum after filtering at the low-IF.

Referring to the FIG. 20 the output spectrum of the IF BP filter of the receiver in FIG. 13 is illustrated. After passing the present IF BP filter the strong out-of band interferers are practically eliminated. Similarly, the two CM-references that fell outside its passband are eliminated. That leaves only the desired in-band spectrum at the output of IF BP filter.

Other features that are considered as characteristic for the invention are set forth in the appended claims.

Although the invention is illustrated and described herein as embodied in a circuit configuration for automatically-tuned fully-integrated continuous-time active real bandpass filters, it is, nevertheless, not intended to be limited to the details shown because various modifications and structural changes may be made therein without departing from the spirit of the invention and within the scope and range of equivalents of the claims.

I claim:

1. A tuning system for continuous time filters comprising: a real bandpass filter for receiving a differential input signal and a common-mode reference signal wherein said real bandpass filter is simultaneously tuned using said common-mode reference signal, said real bandpass filter is an on-chip active device and includes two identical bandpass filters.

2. The tuning system of claim 1 wherein said two identical bandpass filters each include at least a pair of biquadratic resonators.

3. The tuning system of claim 2 and further including an on-chip automatic frequency-tuning system.

4. The tuning system of claim 3 and further including an on-chip automatic Q-tuning system.

5. The tuning system of claim 4 wherein said automatic frequency-tuning system includes a center-frequency and adjusts said center-frequency with respect to said common-mode reference signal.

6. The tuning system of claim 5 wherein for each pair of biquadratic resonators said automatic frequency-tuning system compares the magnitudes of a bandpass and a lowpass transfer function and locks at the frequency for which said transfer functions are equal.

7. The tuning system of claim 6 wherein said frequency-tuning system controls the magnitudes of said bandpass and said lowpass transfer functions by changing a resonance frequency through the modification of an electronically adjustable parameter that controls the resonance frequency.

8. The tuning system of claim 7 wherein said automatic Q-tuning system adjusts its magnitude, and thereby the Q-factor, with respect to a reference amplitude.

9. The tuning system of claim 8 wherein for each pair of biquadratic resonators said Q-tuning system compares the average magnitude of said bandpass and said lowpass transfer functions at the reference frequency and locks the transfer function to the value of the Q-reference.

10. The tuning system of claim 9 wherein said Q-tuning system controls the average magnitude of said bandpass and said lowpass transfer functions at the reference frequency by electronically adjusting the phase of a resonator within said Q-tuning system.

11. The tuning system of claim 10 wherein said real bandpass filter is tunably by changing its center frequency and its bandwidth.

12. The tuning system of claim 11 wherein said real bandpass filter is fabricated in monolithic technology selected from the group consisting of silicon CMOS, BiCMOS and bipolar processes, or a non-silicon process.

13. The tuning system of claim 12 wherein said real bandpass filter can be implemented in any active filter design technique selected from the group consisting of Q-encoded LC filters, active R-C filters, MOSFET-C filters, $g_m$-C filters, $g_m$-active C filters or any other active filter design technique.

14. The tuning system of claim 2 wherein for each pair of said biquadratic resonators said differential input signal is cancelled and a lowpass and bandpass output reference is extracted by two summers.

15. The tuning system of claim 14 wherein for each pair of said biquadratic resonators said common-mode reference signal is cancelled and said bandpass output differential signals are extracted by subtractors.

16. The tuning system of claim 2, wherein said real bandpass filter is tuned with said common-mode reference signal falling into its passband.

17. The tuning system of claim 2, wherein said resonators includes a $g_m$-C resonator without a $1/g_m$ resistor allowing for less loss and higher resonator Q.

18. The tuning system of claim 2 and further including an inverter-based integrator having no common-mode feedback circuit and a dc-output voltage controlled by device matching in connection with a low output impedance of submicron MOS devices.

19. The tuning system of claim 2 wherein said identical bandpass filters are single-ended circuits.

20. The tuning system of claim 19 wherein said identical bandpass filters are each fed with either a negative or a positive single-ended input signal and said common-mode reference signal is a common-mode single-ended reference signal.

21. The tuning system of claim 20 and further including: a single-ended output summer for canceling said input signal and extracting said reference signal; and a differential output subtractor for canceling said reference signal and extracting the input signal.

22. The tuning system of claim 2 wherein said identical bandpass filters are differential circuits.

23. The tuning system of claim 22 wherein said identical bandpass filters are each fed with a pair of differential input signals in anti-phase and a pair of in-phase differential reference signals.

24. The tuning system of claim 23 and further including:
a differential input/output summer for canceling the input signal and extracting the reference; and
a differential input-double-difference output subtractor for canceling the reference signal and extracting the input signal.

* * * * *

UNITED STATES PATENT AND TRADEMARK OFFICE
CERTIFICATE OF CORRECTION

PATENT NO.        : 7,400,212 B2                                                Page 1 of 1
APPLICATION NO. : 11/146379
DATED             : July 15, 2008
INVENTOR(S)       : Vishinsky It is certified that error appears in the above-identified patent and that said Letters Patent is hereby corrected as shown below:

Column 1, line 59-60, Delete "Salve" and insert --Slave--.

Signed and Sealed this

Thirtieth Day of September, 2008

JON W. DUDAS
*Director of the United States Patent and Trademark Office*